United States Patent
Panicacci

(10) Patent No.: US 8,736,726 B2
(45) Date of Patent: May 27, 2014

(54) PIXEL TO PIXEL CHARGE COPIER CIRCUIT APPARATUS, SYSTEMS, AND METHODS

(75) Inventor: Roger Panicacci, San Clemente, CA (US)

(73) Assignee: Micron Technology, Inc., Boise, ID (US)

( * ) Notice: Subject to any disclaimer, the term of this patent is extended or adjusted under 35 U.S.C. 154(b) by 1553 days.

(21) Appl. No.: 11/769,517

(22) Filed: Jun. 27, 2007

(65) Prior Publication Data

US 2009/0002539 A1    Jan. 1, 2009

(51) Int. Cl.
*H04N 3/14* (2006.01)
*H04N 5/335* (2011.01)

(52) U.S. Cl.
USPC .......................................... 348/294; 348/306

(58) Field of Classification Search
None
See application file for complete search history.

(56) References Cited

U.S. PATENT DOCUMENTS

| | | | |
|---|---|---|---|
| 6,140,630 A | 10/2000 | Rhodes | |
| 6,204,524 B1 | 3/2001 | Rhodes | |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,376,868 B1 | 4/2002 | Rhodes | |
| 6,633,029 B2 * | 10/2003 | Zarnowski et al. | 250/214 R |
| 7,602,429 B2 * | 10/2009 | Kok | 348/300 |
| 2002/0060741 A1 | 5/2002 | Kusaka | |
| 2006/0187329 A1 | 8/2006 | Panicacci | |

FOREIGN PATENT DOCUMENTS

| | | |
|---|---|---|
| CN | 1868207 A | 11/2006 |
| GB | 2302472 | 1/1997 |
| GB | 2302472 A | 1/1997 |
| KR | 1020010061385 A | 7/2001 |
| KR | 1020060060695 A | 6/2006 |
| WO | WO-2005057902 A2 | 6/2005 |

OTHER PUBLICATIONS

Panicacci, Roger , "Method and Apparatus Providing Pixel Storage Gate Charge Sensing for Electronic Stabilization in Imagers", U.S. Appl. No. 11/331,121, filed Jan. 13, 2006.
"Chinese Application Serial No. 200880022315.9, Decision on Rejection mailed Jun. 8, 2012", 7 pgs.
"Chinese Application Serial No. 200880022315.9, First Office Action mailed Jun. 7, 2011", 12 pgs.
"European Application Serial No. 08779854.2, Office Action mailed Feb. 15, 2012", 4 pgs.
"European Application Serial No. 08779854.2, Response filed Jun. 18, 2012 to Office Action mailed Feb. 15, 2012", 24 pgs.

(Continued)

*Primary Examiner* — Justin P Misleh
(74) *Attorney, Agent, or Firm* — Schwegman, Lundberg & Woessner, P.A.

(57) ABSTRACT

Methods, apparatus and systems may operate to copy pixel charge, compensating for image subject shift within in an imaging array during exposure time of an imaging device. Activities may include transferring charge from one or more source pixels to one or more buffer pixels within the same pixel array, and copying the charge to destination pixels within the same pixel array prior to an end of the image integration time. Charge transfer may include transfer of charge from more than one array on a single die. Additional activities may include transferring charge from one or more source pixels to one or more destination pixels multiple times prior to the end of the image integration time.

34 Claims, 5 Drawing Sheets

(56) References Cited

OTHER PUBLICATIONS

"Korean Application Serial No. 10-2010-7001777, Amendment filed Jun. 27, 2013", 26 pgs.

"Korean Application Serial No. 10-2010-7001777, Office Action mailed Jul. 15, 2013", 4 pgs.

"Korean Application Serial No. 10-2010-7001777, Notice of Preliminary Rejection mailed Nov. 1, 2013", 7 pgs.

"Korean Application Serial No. 10-2010-7001777, Response filed Sep. 26, 2013 to Office Action mailed Jul. 15, 2013", 16 pgs.

* cited by examiner

PIXEL TO PIXEL CHARGE COPIER CIRCUIT APPARATUS, SYSTEMS, AND METHODS

TECHNICAL FIELD

This disclosure relates generally to imaging devices, including apparatus, systems, and methods for pixel to pixel charge copying to compensate for image shift during exposure time of an imaging device.

BACKGROUND

There are many different types of semiconductor-based imagers, including charge coupled devices (CCDs), photodiode arrays, charge injection devices and hybrid focal plane arrays. Because CCD technology provides large array sizes having small pixel sizes (high resolution), they are well-suited for imaging applications where space is at a premium. However, in some applications, CCD imagers are susceptible to radiation damage, require good light shielding to avoid image smear, exhibit relatively high power dissipation, and are difficult to integrate with CMOS processing. As a matter of contrast, a complementary metal-oxide semiconductor (CMOS) imager may exhibit low voltage operation and low power consumption, while providing relatively low fabrication costs and compatibility with existing CMOS control logic and image processing. Further, CMOS imagers may also offer random access to the image data without using pixel to pixel transfer operations during image acquisition.

A CMOS imaging device includes an array of pixel cells, each of which may comprise a photosensor, such as a photogate, photoconductor, or photodiode overlying a substrate. The photosensor is used to accumulate charge as a function of received light over an integration period. Each pixel cell may further comprise a readout circuit that includes an output field effect transistor (FET) formed in the substrate with a sensing node, such as a floating diffusion node, connected to the gate of an output transistor. The imager may include an additional transistor for transferring charge from the underlying portion of the substrate to the sensing node, and a transistor for resetting the sensing node to a specified charge level prior to charge transfer.

Image blur from a moving subject during the image acquisition time (e.g., exposure time) may be resolved by either tracking the imaged subject with the CMOS imager, or reading the CMOS image sensor at higher speeds. Reading image sensors at higher speeds often translates to using higher speed processing, with a commensurate increase in capacity to store multiple frames of the digitized image in external memory. Thus, there is a need for apparatus, systems, and methods that operate to increase the speed at which image data can be processed within and by image sensors.

DETAILED DESCRIPTION

Some of the disclosed embodiments provide a method for pixel to pixel charge copying to compensate for image subject shift within in an imaging array during exposure time of an imaging device. The term "pixel" as used herein refers to a photo-element unit cell containing a photo-conversion device or photosensor and transistors for processing an electrical signal from electromagnetic radiation sensed by the photo-conversion device. In an embodiment, an array of image sensors, arranged in rows and columns, may copy charge from a starting row of pixels, or source pixels, to a row of temporary storage pixels, or buffer pixels. The charge stored in the buffer pixels is then copied to an ending row of pixels, or destination pixels. Pixel to pixel charge copying permits re-registering image data within the analog domain of the image array that may be useful in reducing image blurring associated with movement of the image subject during exposure time.

There are a number of applications that utilize sense capability within a pixel array prior to reading information from the array. Examples include motion sensing (e.g., subject moving within field of view of a camera or camera jitter), automatic exposure, and automatic white balancing. The ability to detect image motion prior to completion of the exposure (or integration) time can reduce or eliminate image blur in addition to determining lighting conditions. One method of reducing blur is through the use of CMOS image sensors which use built-in circuitry to fix the imager to the subject during exposure. Additionally, charge transfer may occur between two or more arrays on a single die, such as multiple color arrays on a single die. In such an example, rows of sensors may be copied in sequence to avoid over-writing destination sensor data.

In a CMOS imaging device, there are certain active elements of a pixel cell that can provide the following functions: (1) photon to charge conversion; (2) accumulation of image charge; (3) transfer of charge to the sensing node with charge amplification; (4) resetting of the sensing node to a known state prior to charge transfer to the node; (5) selection of pixel readout; and (6) output and amplification of a signal representing pixel charge. The photon charge may be amplified when it transfers from the initial charge accumulation region to the sensing node.

Figure 1:
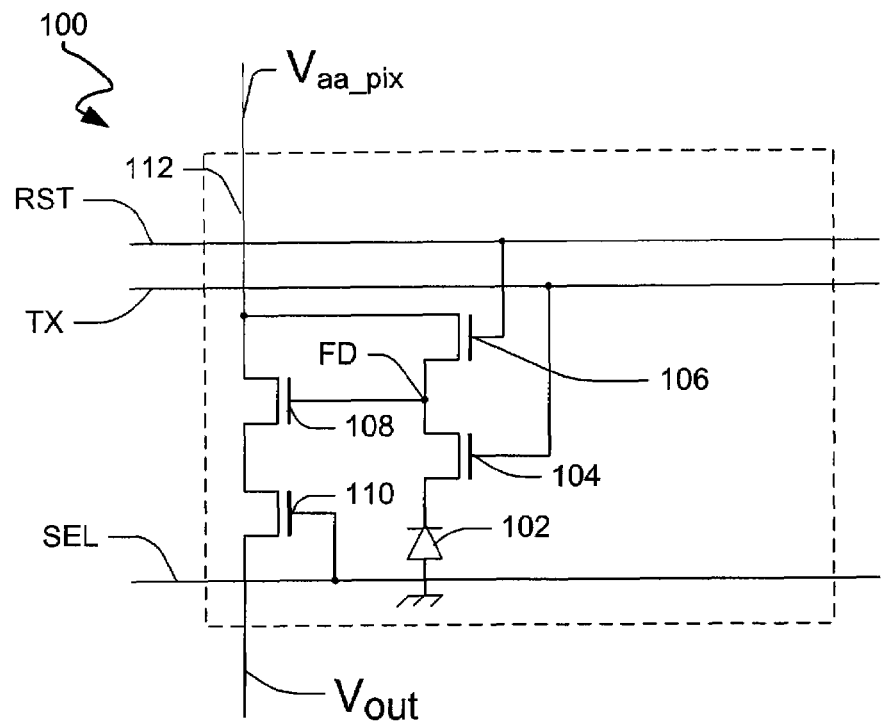
FIG. 1 is a CMOS imager circuit according to various embodiments of the invention.

FIG. 1 is a CMOS imager circuit according to various embodiments of the invention. The pixel type shown is often called a four transistor (4T) CMOS imager pixel 100. The pixel 100 includes a photosensor 102 (e.g., photodiode), transfer transistor 104, floating diffusion region FD, reset transistor 106, source follower 108 and row select transistor 110. The photosensor 102 is connected to the sensing node or floating diffusion region (FD) by the transfer transistor 104 when the transfer transistor 104 is activated by a transfer gate control signal (TX). The reset transistor 106 is connected between the floating diffusion region FD and an array pixel supply voltage $V_{aa\_pix}$, and activated by reset gate control signal (RST).

The gate of the source follower transistor 108 is connected to the floating diffusion region FD. The source of the source follower transistor 108 is connected to array pixel supply voltage $V_{aa\_pix}$ while its drain is connected to the source of row select transistor 110.

The source follower 108 converts the charge stored at the floating diffusion region FD into an electrical output voltage signal $V_{out}$. The row select transistor 110 may be controlled by a row select signal SEL to connect the source follower transistor 108 and $V_{out}$ to a column line 112 of a pixel array. The row select signal SEL is used to identify which pixels will be active at a given time. In this manner, only pixels affected by an image shift during the integration time will experience a charge transfer, saving both time and unnecessary transfer noise within the system.

Although the imager shown in FIG. 1 illustrates a single pixel, it should be understood that in many embodiments, there will be an array of many pixels arranged in rows and columns, with the pixels of the array accessed using row and column select circuitry. According to some embodiments, there may also be a storage gate transistor located between the photosensor 102 and the transfer transistor 104, which would provide storage for the photosensor 102 prior to a charge copy operation, making photosensor 102 available for new image acquisition more quickly.

Figure 2:
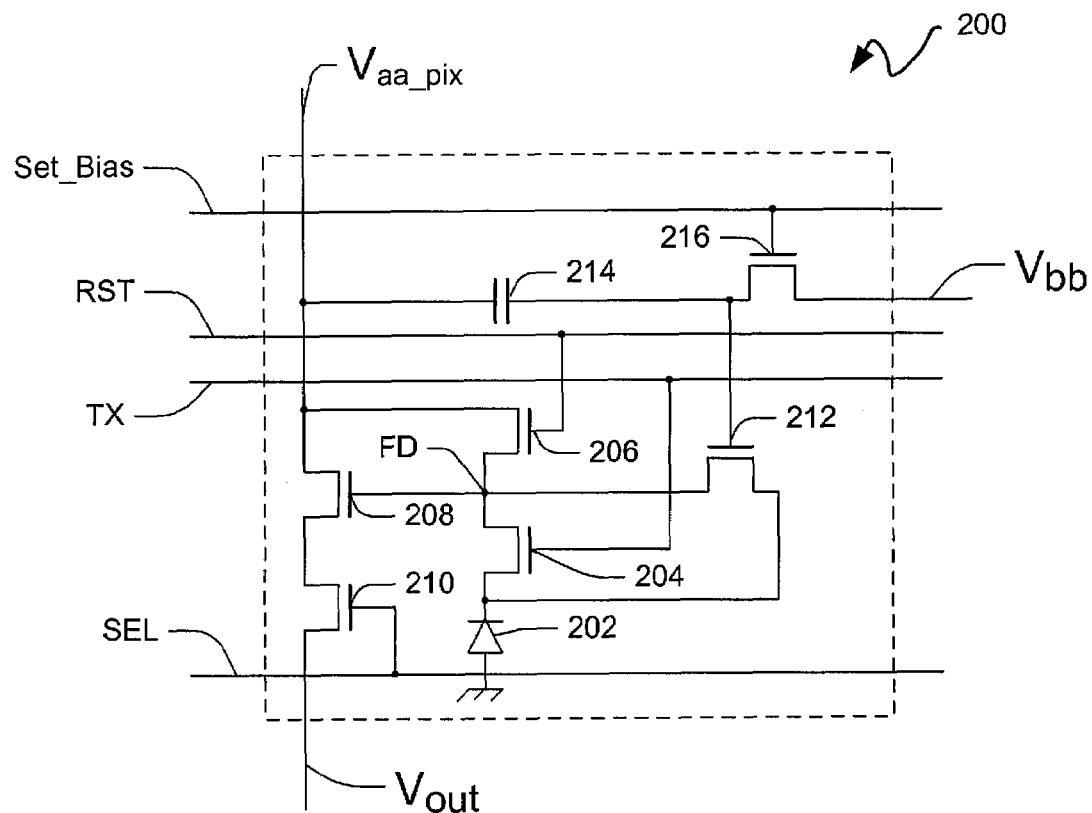
FIG. 2 is a CMOS imager circuit including an injection capability according to various embodiments of the invention.

FIG. 2 is a CMOS imager circuit including an injection capability according to various embodiments of the invention. The pixel 200 includes a photosensor 202 (e.g., photodiode), transfer transistor 204, floating diffusion region FD, reset transistor 206, source follower 208 and row select transistor 210. The photosensor 202 is also connected to the floating diffusion region FD by the injection transistor 212 which may be used to equalize the voltage on the floating diffusion region FD sense node of one or more buffer pixels to the current pixel floating diffusion region FD via capacitor 214. The gate of injection transistor 212 is controlled by a distributed amplifier configured to equalize the floating diffusion region FD sense nodes of two or more buffer pixels as determined by bias transistor 216, using (Set_Bias) control signal. A similar result may be accomplished without the added capacitor 214, but may be more susceptible to noise, as described in more detail below.

According to one embodiment, the pixel configuration of FIG. 2 may copy charge from a starting row of pixels within an array to a buffer row of pixels, or buffer pixels, residing in the same pixel array. The charge stored in the buffer pixels may then be transferred to a destination row of pixels. The charge stored may represent either data acquired, such as a signal voltage, or a reference voltage to provide a zero signal reference, according to various embodiments. During charge transfer, the charge stored may include a combined signal voltage and reference voltage, according to various embodiments.

An array configured using pixels 200 may include a distributed amplifier consisting of the source followers in the destination pixels and buffer pixels accompanied by additional circuitry to support amplifier current sources and loads. One method of performing the charge copy operation from the buffer row of pixels to the destination row of pixels includes subtracting charge from the pixels' floating diffusion regions FD using the added injection transistor as controlled by a distributed amplifier. Noise reduction should be considered and can become more problematic when detecting small amounts of charge. One method of choosing a data transfer speed that takes noise into account is to maintain the pixel copy operation noise below the noise of the signal chain readout noise (e.g., sample/hold, gain, ADC).

Figure 3:
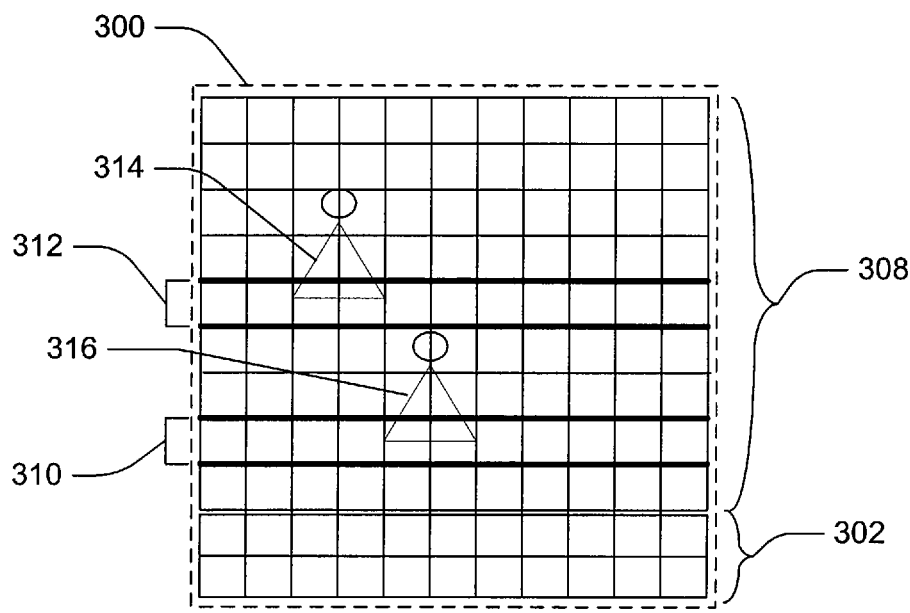
FIG. 3 is an array of pixels having a set of buffer pixels, illustrating movement of an image prior to the end of the integration time according to various embodiments of the invention.

FIG. 3 is an array 300 of pixels having a set of buffer pixels 302 and illustrating movement of an image within the array 300 prior to the end of the integration time, according to various embodiments of the invention. In this example, the array 300 is organized as rows and columns of pixels (e.g., similar to or identical to pixels 100 and 200 of FIGS. 1 and 2, respectively). The upper portion of active pixels 308 comprise the region within which an image may be acquired during the integration time of the image acquisition. The lower portion of buffer pixels 302 comprise dedicated pixels which may be used for temporary pixel data shift operations that occur when an image changes position within the array 300 prior to the end of the integration time.

In some instances, first position image 314 shifts to second position image 316 during the integration time. In this simplified diagram, first position pixel row 312 contains data representative of the lower portion of first position image 314 prior to image shift. When image shift, also referred to as motion sensing, is sensed, the data in first position pixel row 312 may be transferred to buffer pixels 302 and subsequently repositioned within second position pixel row 310. This process may be repeated for each pixel in the array 300 that is affected by the image shift. This process may be repeated multiple times prior to the end of the integration time.

One example of a system that can utilize the charge copy operation described herein, according to one embodiment of the present invention, includes a digital camera having an array of pixels and a motion sense capability (e.g., gyroscope, accelerometer, or other external motion sensor). Alternatively, motion sensing may be provided using specialized sensor motion detection circuits as described in pending, commonly assigned, U.S. patent application Ser. No. 11/331, 121, entitled "METHOD AND APPARATUS PROVIDING PIXEL STORAGE GATE CHARGE SENSING FOR ELECTRONIC STABILIZATION IN IMAGERS," filed Jan. 13, 2006, which is incorporated by reference in its entirety, including a description of a scene sensing technique for imagers.

Figure 4:
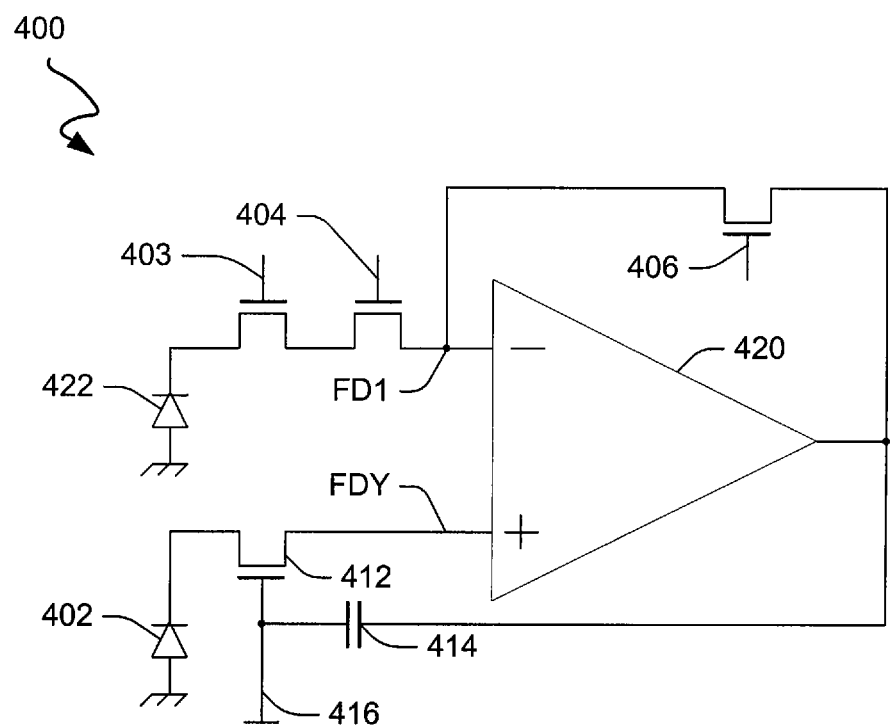
FIG. 4 is a schematic diagram of a charge copy circuit using a CMOS imager and a distributed amplifier illustrating data transfer from a source pixel to a buffer pixel according to various embodiments of the invention.

FIG. 4 is a schematic diagram of a charge copy circuit 400 using a CMOS imager and a distributed amplifier illustrating data transfer from a source pixel to a buffer pixel, according to various embodiments of the invention. When an image shift has been sensed, either internally or externally, the reference of the buffer pixels may be matched to that of the source pixels in order to reduce unwanted bias or other sources of inaccuracy. Distributed amplifier 420 may establish a reference charge level, or reference voltage, between the start photosensor 422 and a buffer photosensor 402. This may be accomplished by transferring the floating diffusion region FD voltage from buffer node FDY to start node FD1 by activating the reset transistor 406 while applying voltage $V_{bias}$ 416 to the gate of the injection transistor 412. In certain examples, voltage $V_{bias}$ 416 is approximately 0.5 VDC and is coupled to capacitor 414 that is driven by the distributed amplifier 420 output (settling to the reset reference level). During the reset mode, charge on the start photosensor 422 may be isolated from the floating diffuision region FD node by a disabled transfer transistor 404. Also shown is an optional storage gate transistor 403, which may be used as a temporary storage for the charge contained in start photosensor 422. In the event that storage gate transistor 403 is used, start photosensor 422 may become available for charge storage after its charge has transferred to storage gate transistor 403. These operations can be conducted for each pixel in the source and destination (e.g., buffer) areas. In certain examples, a switch may connect the buffer photosensor 402 to ground in order to fill the buffer photosensor 402 with electrons prior to the copy operation.

After the reference charge is matched between the source pixels of the array and the buffer pixels, the source pixel data may then be transferred from at least one source pixel to at least one buffer pixel. One method to accomplish this is to disable reset transistor 406, enable transfer transistor 404, and disable voltage $V_{bias}$ 416, allowing source data to transmit within the array. When this occurs, the gate of injection transistor 412 may rise in potential sufficient to track charge transferring to start node FD1 by transferring charge from the photosensor 402, that was initially filled with electrons, to node FDY. Capacitor 414 may decouple the DC (direct current) level of distributed amplifier 420 output in addition to the injection transistor 412 voltage which may be above or equal to its gate threshold. Because the output of distributed amplifier 420 is inverting, some charge may transfer to buffer node FDY. When transfer is completed, transfer transistor 404 may be disabled while any residual charge dissipates. Voltage $V_{bias}$ 416 may then be enabled to prevent floating nodes from receiving more charge.

Figure 5:
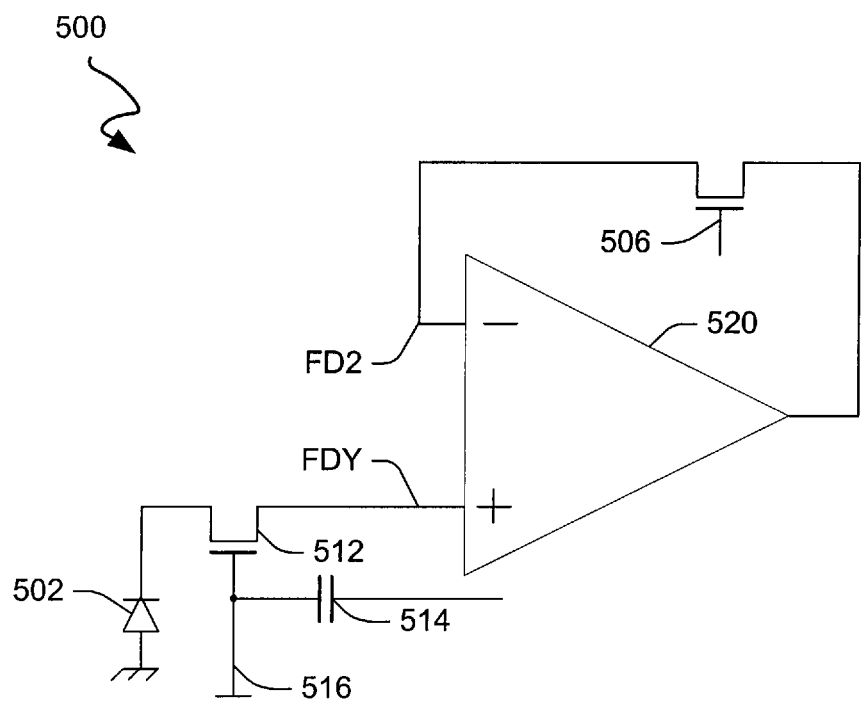
FIG. 5 is a schematic diagram of a charge copy circuit using a CMOS imager and a distributed amplifier illustrating reference matching from a buffer pixel to a destination pixel according to various embodiments of the invention.

Upon completion of source pixel data transfer to at least one buffer pixel, the reference of the destination pixel, or final pixel location, may be set prior to data transfer. FIG. 5 is a schematic diagram of a charge copy circuit 500 using a CMOS imager and a distributed amplifier illustrating reference matching from a buffer pixel to a destination pixel, according to various embodiments of the invention. Distributed amplifier 520 may establish a reference charge level between buffer node FDY and destination node FD2. This may be accomplished by transferring the floating diffusion region FD voltage from buffer node FDY to destination node FD2 by activating the reset transistor 506 while applying voltage $V_{bias}$ 516 to the gate of the injection transistor 512. This may be the same procedure used to establish a reference charge level between the start photosensor 422 and a buffer photosensor 402, as illustrated in FIG. 4.

Alternatively, the stored charge in the buffer pixel may include both the signal voltage and the reference voltage to be copied to the destination pixel prior to re-establishing a reference voltage on the buffer pixel. After this is done, the stored charge remaining on the buffer pixel may consist of the reference voltage only. The potential on destination node FD2 may be approximately equal to the reset voltage level less the signal level of the buffer photosensor. Capacitor 514 remains floating relative to amplifier 520. Once the reference is established on the destination pixel, the buffer pixel data may then be transferred from at least one buffer pixel to at least one destination pixel.

Figure 6:
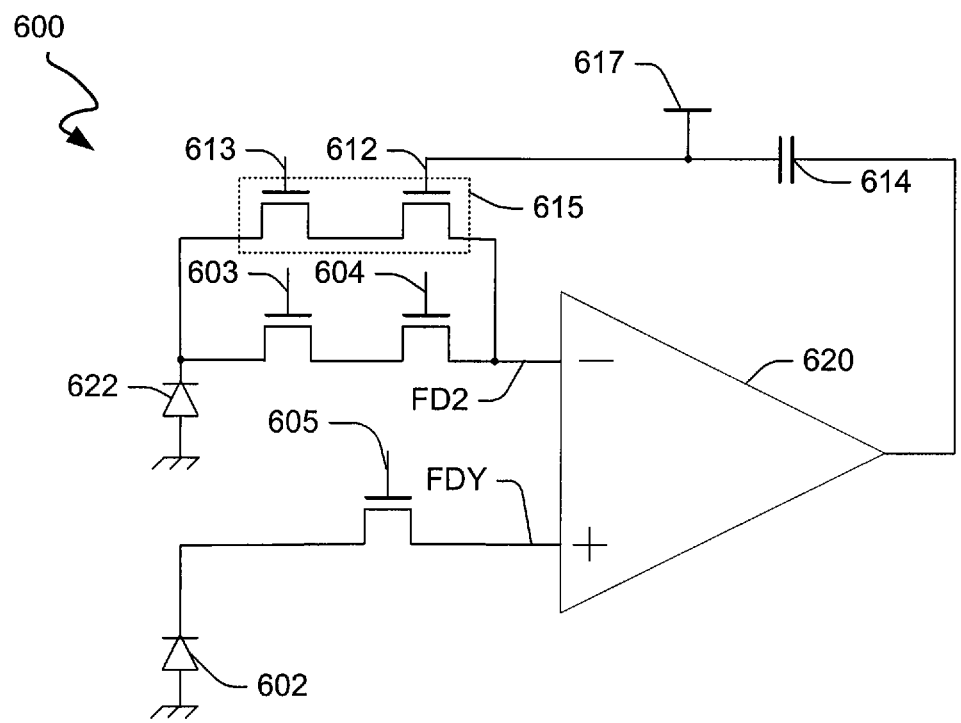
FIG. 6 is a schematic diagram of a charge copy circuit using a CMOS imager and a distributed amplifier illustrating data transfer from a buffer pixel to a destination pixel after reference matching has occurred according to various embodiments of the invention.

FIG. 6 is a schematic diagram of a charge copy circuit 600 using a CMOS imager and a distributed amplifier illustrating data transfer from a buffer pixel to a destination pixel after reference matching has occurred, according to various embodiments of the invention. One method to accomplish data transfer from a buffer pixel to a destination pixel is to set node FDY back to the known reference level. When this occurs, the gate of injection transistor 612 may rise in potential sufficiently to track the charge transferring from destination node FD2 on distributed amplifier 620. The charge well 615, comprised of the combination of injection transistor 613 and injection charge transistor 612, may be used to attract electrons to assist in charge transfer from buffer node FDY to destination node FD2. This disables $V_{bias}$ 617, allowing source data to transmit within the array. When this occurs, the gate of injection transistor 612 may rise in potential sufficient to track charge transferring to destination node FD2 on distribution amplifier 620. Injection transistor 613 may have a gate voltage ranging from about −0.3 VDC to about +2.8 VDC. Capacitor 614 may be equivalent to capacitor 414 of FIG. 4, and may be used to decouple the DC level. The gate of injection transistor 613 may be set close to its threshold to increase sensitivity to the transferred charge. The resulting stored charge may consist of the difference between the combined signal voltage and reference voltage, copied from the buffer pixel, and the re-established reference voltage. Thus a final signal voltage may remain on the destination pixel. The charge potential of buffer node FDY may be higher than destination node FD2 and can pull up destination node FD2.

The process of pixel charge copy may occur on a row by row basis, and may occur within three to four microseconds (μs) in order to process one thousand rows of pixels within three to four milliseconds (ms). In the example of an exposure time of approximately 200-500 ms, the charge copy operation may happen four to ten times during an exposure time. Reducing the time for charge copy operations can assist in image de-blurring by maintaining the charge signal of interest within the destination pixel for the longest period of time (within the integration time). For example, during an image integration time in which there is no shift of subject matter, the charge signal begins and ends with the destination pixels and image blur may not be problematic. Alternatively, when the subject matter shifts continuously during an image integration time, the charge signal can move numerous times and charge transfer should occur quickly to reduce image blur by the time the destination pixel is reached.

Methods of transferring charge from pixel to pixel within imaging devices, including storage gate operation as described above, may be implemented using a wide variety of electronic devices, such as semiconductor-based imagers, photodiode arrays, and charge injection devices. Further, some embodiments of electronic devices may be realized which utilize the apparatus and methods disclosed herein, including digital cameras having a processor, memory and an energy source.

Figure 7:
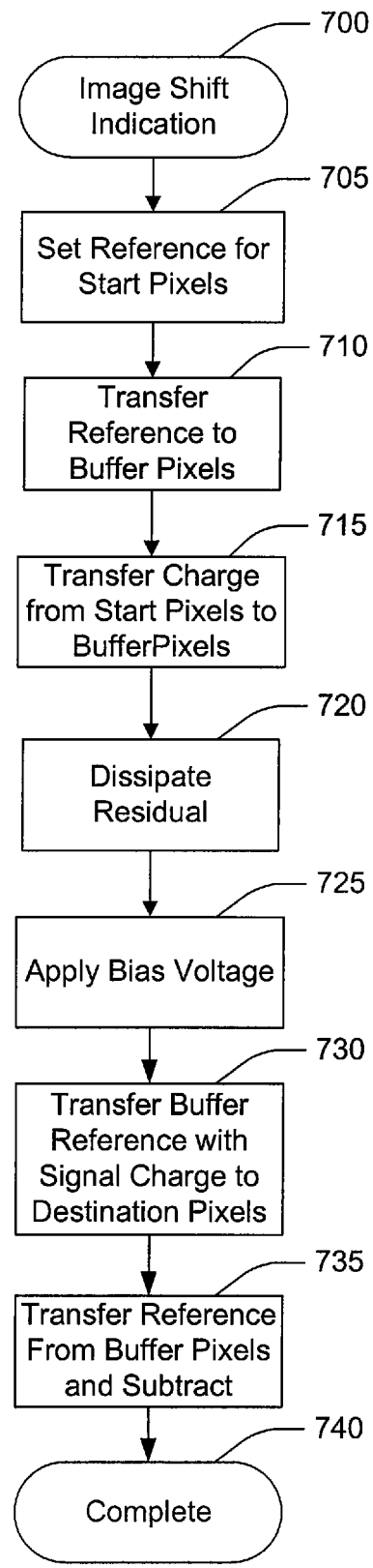
FIG. 7 is a flow diagram illustrating a method of pixel charge copying within an image device pixel array according to one embodiment of the invention.

FIG. 7 is a flow diagram illustrating a method of pixel charge copying within an image device pixel array, according to one embodiment of the invention. In block 700, an indication of image shift, such as that supplied by an internal or external shift or motion sensing device, within at least one pixel of an array of pixels is received by a processor. In one embodiment, the pixel array forms at least a part of a CMOS imaging device. Thus, an indication of image shift can occur within the imaging device as well. In block 705, reset mode is enabled and a reference voltage is applied to one or more first pixels, such as one or more pixels having a stored charge prior to image shift. Starting with a known reference voltage may allow any additional charge related to image capture to be separated at a later step. In order to maintain low noise levels, the distribution amplifier, such as distribution amplifier 420 in FIG. 4, may be designed for high bandwidth and coupled with a low bandwidth reset switch. In block 710, reset mode continues to be enabled and a bias voltage $V_{bias}$ may be applied to an injection transistor gate of the one or more second pixels (e.g., buffer pixels) in order to isolate the stored charge on the one or more second pixels while the reference voltage is transferred from one or more first pixels to the one or more buffer pixels. A capacitor may be used to decouple the distribution amplifier from $V_{bias}$. In one embodiment, the capacitor may be selected to have a value in the femtofarad range (e.g., about $10^{-15}$ farads). The added capacitor is optional and may provide an improved signal-to-noise ratio. Upon completion of the reference voltage transfer, the reset mode may be disabled to allow settling of residual noise just prior to stored charge transfer. If storage gate transistors were used, such as storage gate 403 shown in FIG. 4, this may also be the time to transfer charge from the start photosensor to the storage gate to free up the start photosensor for future use.

In block 715, reset mode may be disabled and the $V_{bias}$ may be disabled while enabling the transfer transistor. Charge may then transfer from the start photosensor to start node FD1 while charge transfers from the buffer photosensor to buffer node FDY. If a storage gate transistor is utilized, it could be disabled at this time. The voltage on start node FD1 may then decrease at the inverting input of the distribution amplifier and the amplifier output may then begin to increase, driving the injection transistor gate higher until buffer node FDY matches start node FD1 and the distribution amplifier output then begins to lower.

At 720, the output of the distribution amplifier drops below the injection transistor gate trip threshold, the injection transistor may then be disabled, completing the charge transfer. Any residual charge may then dissipate and the transfer transistor may then be disabled. At 725, the injection transistor may then be driven further below its gate threshold by applying $V_{bias}$, thereby preventing any floating nodes which may result in a unstable condition. At 730, the reference voltage of the buffer photosensors combined with the signal voltages are copied to the destination photosensors. At 735, the reference voltage is applied to the buffer photosensors and then copied to the destination photosensors, where the resulting final signal voltage is determined by taking the difference of the reference voltage combined with the signal voltage and the reference voltage. At 740, charge transfer is completed and the process involving blocks 700 to 735 may be repeated if another shift has occurred and the integration time has not yet completed for image acquisition.

Figure 8:
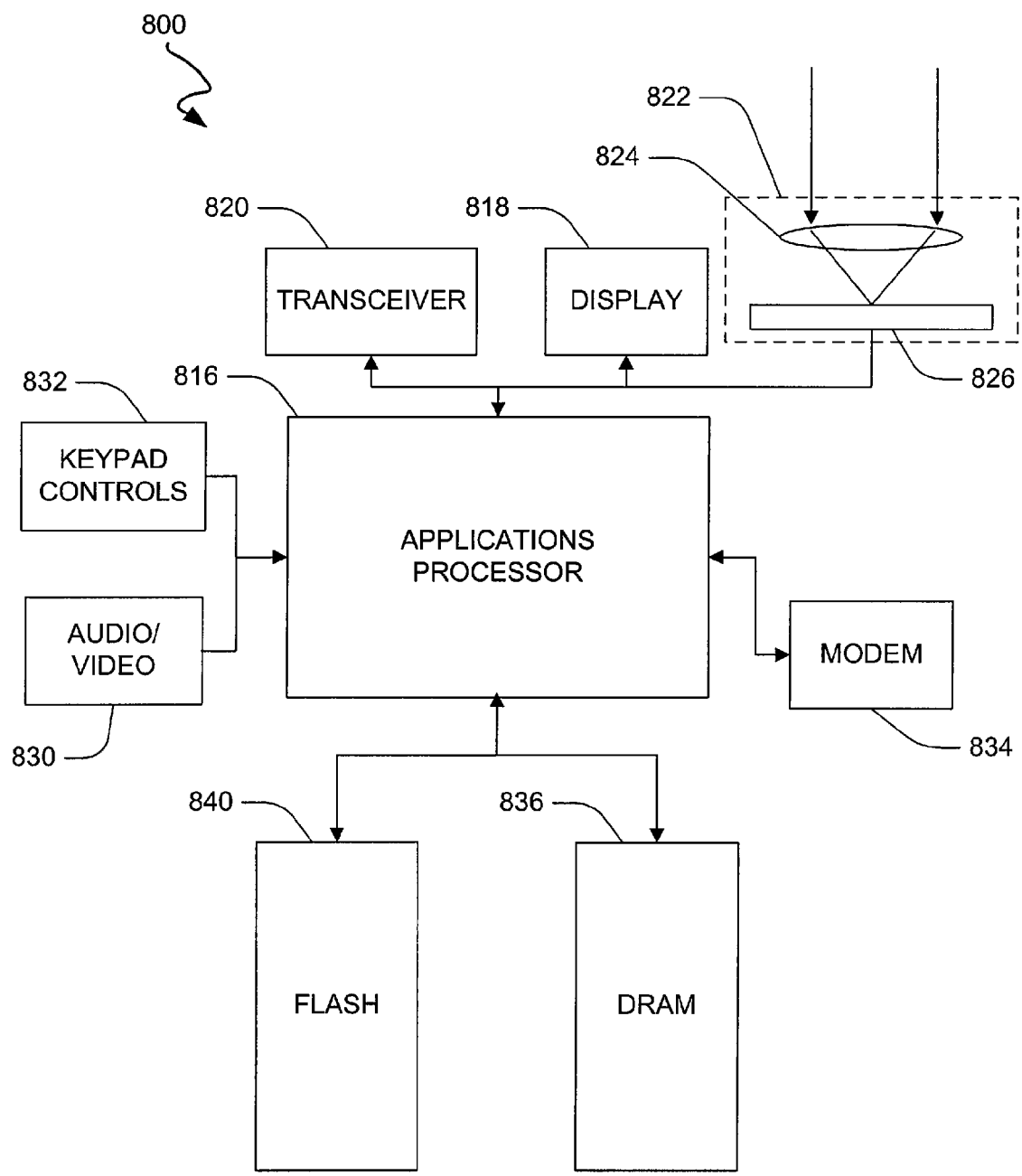
FIG. 8 is a block diagram of a system according to various embodiments of the invention.

FIG. 8 is a block diagram of a system 800 according to various embodiments of the invention. The system 800 may include one or more apparatus, such as an imaging plane 826 that have one or more pixels similar to or identical to that of imager pixel 100 in FIG. 1. The system 800, in some embodiments, may comprise a processor 816 coupled to a display 818 to display data processed by the processor 816. The system 800 may also include a wireless transceiver 820 (e.g., a cellular telephone transceiver) to receive and transmit data processed by the processor 816.

The memory system(s) included in the apparatus 800 may include dynamic random access memory (DRAM) 836 and non-volatile flash memory 840 coupled to the processor 816. In various embodiments, the system 800 may comprise a camera 822, including a lens 824 and an imaging plane 826 coupled to the processor 816. The imaging plane 826 may be used to receive light rays 828 captured by the lens 824. Images captured by the lens 824 may be stored in the DRAM 836 and the flash memory 840. The lens 824 may comprise a wide angle lens for collecting a large field of view into a relatively small imaging plane 826.

In many embodiments, the camera 822 may contain an imaging plane 826 having charge copy circuitry similar to or identical to the charge copy circuits 400, 500, and 600 of FIGS. 4, 5, and 6, respectively. Many variations of system 800 are possible. For example, in various embodiments, the system 800 may comprise an audio/video media player 830, including a set of media playback controls 832, coupled to the processor 816. In various embodiments, the system 800 may comprise a modem 834 coupled to the processor 816.

Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments will be apparent to those of skill in the art upon reviewing the above description. The scope of the present subject matter should be determined with reference to the appended claims, along with the full scope of equivalents to which such claims are entitled.

The examples that are described in the above description provide sufficient detail to enable those skilled in the art to practice the inventive subject matter, and serve to illustrate how the inventive subject matter may be applied to various embodiments. References to "an", "one", or "various" embodiments in this disclosure are not necessarily to the same embodiment, and such references may contemplate more than one embodiment. Other embodiments may be utilized, and structural, logical, and electrical changes may be made without departing from the scope of the present disclosure. The terms "data" and "information" may be used interchangeably herein. The term "stored charge" as used herein means a voltage potential residing on a capacitive or diode device such as a photosensor. The terms "signal voltage" and "reference voltage" refer to voltages representing acquired data and a zero reference, respectively.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method, comprising:
    determining an acquired image shift distance associated with a first set of pixels included in a plurality of pixels after a beginning of an integration time associated with the plurality of pixels;
    moving stored charge from the first set of pixels to a second set of pixels included in the plurality of pixels;
    selecting a third set of pixels included in the plurality of pixels wherein the selecting includes determining a distance between the first set of pixels and the third set of pixels in proportion to the acquired image shift distance; and moving the stored charge from the second set of pixels to the third set of pixels prior to an end of the integration time.

2. The method of claim 1, comprising:
wherein moving the stored charge from the second set of pixels to the third set of pixels occurs more than once prior to the end of the integration time.

3. The method of claim 1, comprising:
assigning the second set of pixels to the first set of pixels after the determining.

4. The method of claim 3, wherein the assigning comprises:
transferring a reference voltage from an energy source to the second set of pixels.

5. The method of claim 4, wherein the transferring is followed by copying the reference voltage from the second set of pixels to the first set of pixels.

6. The method of claim 1, wherein the selecting comprises:
transferring a reference voltage from the second set of pixels to the third set of pixels.

7. The method of claim 1, wherein moving the stored charge from the first set of pixels to the second set of pixels comprises:
dissipating a residual charge remaining on a gate within the first set of pixels.

8. A method, comprising:
transferring a reference voltage from an energy source to a first set of pixels included in a plurality of pixels after a beginning of an integration time associated with the plurality of pixels;
assigning the first set of pixels to a second set of pixels included in the plurality of pixels;
transferring the reference voltage from the first set of pixels to the second set of pixels;
moving stored charge from the second set of pixels to the first set of pixels; and
transferring the reference voltage from the first set of pixels to a third set of pixels included in the plurality of pixels.

9. The method of claim 8, wherein transferring the reference voltage from the first set of pixels to the third set of pixels occurs prior to an end of the integration time.

10. The method of claim 8, wherein transferring the reference voltage from the first set of pixels to a third set of pixels occurs more than once prior to an end of the integration time.

11. The method of claim 8, comprising:
dissipating a residual charge on a gate within the second set of pixels after the moving.

12. The method of claim 8, comprising:
applying a bias voltage to a gate within the second set of pixels after the moving.

13. The method of claim 8, comprising:
moving the stored charge from the first set of pixels to the third set of pixels, wherein the moving occurs prior to an end of the integration time.

14. The method of claim 8, wherein the transferring the reference voltage from the first set of pixels to the third set of pixels includes:
assigning the first set of pixels to the third set of pixels included in the plurality of pixels prior to the transferring.

15. The method of claim 14, wherein the assigning the first set of pixels to a third set of pixels includes:
determining an acquired image shift distance associated with the second set of pixels.

16. A method, comprising:
applying a reference voltage to a first row of pixels comprising at least two pixels in an array of pixels after a beginning of an integration time associated with acquiring an image;
transferring the reference voltage from the first row to a second row of pixels in the array of pixels, the second row of pixels comprising at least an equal number of pixels as the first row of pixels;
copying stored charge from the second row of pixels to the first row of pixels;
transferring the reference voltage from the second row of pixels to a third row of pixels comprising at least an equal number of pixels as the first row of pixels; and
copying the stored charge from the first row of pixels to the third row of pixels.

17. The method of claim 16, comprising:
dissipating residual noise after the copying or the shifting.

18. The method of claim 16, wherein the location of the third row of pixels is in proportion to an acquired image shift distance of the first row of pixels occurring prior to an end of the integration time.

19. An apparatus comprising:
an imaging device organized as an array of pixels, wherein some of the pixels comprise:
a photosensor;
an injection gate to inject a reference voltage into the photosensor during an integration time associated with acquiring an image;
a bias gate coupled to the injection gate to supply the reference voltage to the injection gate; and
a transfer gate coupled to the photosensor to transfer charge between pixels in the array.

20. The apparatus of claim 19, comprising:
a capacitor coupled to the injection gate to dissipate noise.

21. The apparatus of claim 19, comprising:
an energy source coupled to the bias gate, the energy source to supply the reference voltage to the photosensor.

22. The apparatus of claim 19, comprising:
a reset gate coupled to the transfer gate to balance the reference voltage between at least two pixels in the array.

23. The apparatus of claim 19, comprising:
a source follower gate coupled to the reset gate, the source follower gate to generate an output voltage from the charge; and
a row select gate to couple the output voltage to a column line within the pixel array.

24. The apparatus of claim 19, wherein the array of pixels comprises rows of the pixels and columns of the pixels.

25. A system comprising:
a lens; and
an imaging device including a controller to couple to a processor, the imaging device to acquire an image captured by the lens and to communicate resulting image information to the processor, the imaging device comprising:
a plurality of pixels organized as an array of rows and columns, each pixel in the plurality of pixels comprising a photosensor and at least one gate to store a charge from the photosensor during an integration time associated with acquiring the image, wherein the controller is to transfer the charge from a first set of pixels in the plurality of pixels to a second set of pixels in the plurality of pixels, and from the second set of pixels in the plurality of pixels to a third set of pixels in the plurality of pixels by copying the charge.

26. The system of claim 25, wherein the at least one gate is included in a storage gate transistor.

27. The system of claim 25, comprising:
noise suppression circuitry coupled to the at least one gate to suppress residual noise.

28. The system of claim 24, comprising:
a cellular telephone transceiver to transmit a portion of the image information.

29. The system of claim 24 comprising:
a media player and a keypad control module to couple to the processor.

30. The system of claim 24 comprising:
a display device to couple to the processor and to display a portion of the image information.

31. The system of claim 24 comprising:
a flash memory device to couple to the processor and to store a portion of the image information.

32. A method of operating a memory system comprising:
acquiring an image from a lens using an imaging device during an integration time;
transferring charge from a first set of pixels to a second set of pixels in response to receiving an acquired image shift distance signal from a processor, wherein the first set of pixels and the second set of pixels are each organized in the imaging device as rows, each pixel in the array comprising a photosensor and at least one gate for storing the charge from the photosensor during an integration time associated with acquiring the image;
selecting a third set of pixels included in the imaging device wherein the selecting includes determining a distance between the first set of pixels and the third set of pixels in proportion to the acquired image shift distance signal; and
moving the charge after storage, from the second set of pixels to the third set of pixels, prior to an end of the integration time.

33. The method of claim 31, wherein moving the charge after storage, from the second set of pixels to the third set of pixels, occurs more than once prior to the end of the integration time.

34. The method of claim 31, wherein transferring charge from the first set of pixels to the second set of pixel includes:
applying a reference voltage to the first set of pixels after a beginning of the integration time associated with acquiring the image.

* * * * *